US008981560B2

(12) United States Patent
Jensen et al.

(10) Patent No.: US 8,981,560 B2
(45) Date of Patent: Mar. 17, 2015

(54) METHOD AND STRUCTURE OF SENSORS AND MEMS DEVICES USING VERTICAL MOUNTING WITH INTERCONNECTIONS

(71) Applicant: mCube, Inc., San Jose, CA (US)

(72) Inventors: Dave Paul Jensen, Saratoga, CA (US); Hong Wan, Plymouth, MN (US); Jon Ewanich, Los Altos, CA (US)

(73) Assignee: mCube Inc., San Jose, CA (US)

( * ) Notice: Subject to any disclaimer, the term of this patent is extended or adjusted under 35 U.S.C. 154(b) by 82 days.

(21) Appl. No.: 13/923,011

(22) Filed: Jun. 20, 2013

(65) Prior Publication Data
US 2013/0277836 A1    Oct. 24, 2013

Related U.S. Application Data

(62) Division of application No. 13/030,871, filed on Feb. 18, 2011, now Pat. No. 8,476,129.

(60) Provisional application No. 61/367,032, filed on Jul. 23, 2010.

(51) Int. Cl.
| H01L 23/48 | (2006.01) |
| H01L 23/52 | (2006.01) |
| H01L 29/40 | (2006.01) |
| H01L 23/00 | (2006.01) |
| B81B 3/00 | (2006.01) |

(52) U.S. Cl.
CPC .. *H01L 24/05* (2013.01); *B81B 3/00* (2013.01)
USPC ............................ 257/737; 257/750; 257/762

(58) Field of Classification Search
USPC .......................................... 257/737, 750, 762
See application file for complete search history.

(56) References Cited

U.S. PATENT DOCUMENTS

| 3,614,677 A | 10/1971 | Wilfinger |
| 4,954,698 A | 9/1990 | Yasunaga et al. |
| 5,140,745 A | 8/1992 | McKenzie |
| 5,157,841 A | 10/1992 | Dinsmore |
| 5,173,597 A | 12/1992 | Anglin |
| 5,488,765 A | 2/1996 | Kubota et al. |
| 5,493,769 A | 2/1996 | Sakai et al. |
| 5,610,414 A | 3/1997 | Yoneda et al. |
| 5,668,033 A | 9/1997 | Ohara |
| 5,729,074 A | 3/1998 | Shiomi et al. |
| 6,046,409 A | 4/2000 | Ishii et al. |
| 6,076,731 A | 6/2000 | Terrell |
| 6,115,261 A | 9/2000 | Platt et al. |
| 6,188,322 B1 | 2/2001 | Yao |

(Continued)

Primary Examiner — Khiem D Nguyen
Assistant Examiner — Wilner Jean Baptiste
(74) Attorney, Agent, or Firm — Kilpatrick Townsend & Stockton LLP (57) ABSTRACT

A method and structure for fabricating sensor(s) or electronic device(s) using vertical mounting with interconnections. The method includes providing a resulting device including at least one sensor or electronic device, formed on a die member, having contact region(s) with one or more conductive materials formed thereon. The resulting device can then be singulated within a vicinity of the contact region(s) to form one or more singulated dies, each having a singulated surface region. The singulated die(s) can be coupled to a substrate member, having a first surface region, such that the singulated surface region(s) of the singulated die(s) are coupled to a portion of the first surface region. Interconnections can be formed between the die(s) and the substrate member with conductive adhesives, solder processes, or other conductive bonding processes.

11 Claims, 7 Drawing Sheets

(56) References Cited

U.S. PATENT DOCUMENTS

| | | |
|---|---|---|
| 6,263,736 B1 | 7/2001 | Thunder et al. |
| 6,278,178 B1 | 8/2001 | Kwon et al. |
| 6,480,699 B1 | 11/2002 | Lovoi |
| 6,483,172 B1 | 11/2002 | Cote |
| 6,485,273 B1 | 11/2002 | Goodwin-Johansson |
| 6,534,726 B1 | 3/2003 | Okada et al. |
| 6,576,999 B2 | 6/2003 | Sakai et al. |
| 6,656,604 B2 | 12/2003 | Hasewaga |
| 6,753,664 B2 | 6/2004 | Neufeld et al. |
| 6,855,572 B2 | 2/2005 | Jeun et al. |
| 6,912,336 B2 | 6/2005 | Ishii |
| 6,933,165 B2 | 8/2005 | Musolf et al. |
| 6,979,872 B2 | 12/2005 | Borwick et al. |
| 7,019,434 B2 | 3/2006 | Helmbrecht |
| 7,095,226 B2 | 8/2006 | Wan et al. |
| 7,145,555 B2 | 12/2006 | Taylor et al. |
| 7,183,630 B1 | 2/2007 | Fogelson et al. |
| 7,193,312 B2 | 3/2007 | Boon et al. |
| 7,195,945 B1 | 3/2007 | Edelstein et al. |
| 7,239,000 B2 | 7/2007 | Witcraft et al. |
| 7,253,079 B2 | 8/2007 | Hanson et al. |
| 7,258,009 B2 | 8/2007 | Imai |
| 7,358,724 B2 | 4/2008 | Taylor et al. |
| 7,370,530 B2 | 5/2008 | DCamp et al. |
| 7,391,091 B2 | 6/2008 | Tondra |
| 7,402,449 B2 | 7/2008 | Fukuda et al. |
| 7,430,674 B2 | 9/2008 | Van Mueller et al. |
| 7,453,269 B2 | 11/2008 | Won et al. |
| 7,454,705 B2 | 11/2008 | Cadez et al. |
| 7,456,042 B2 | 11/2008 | Stark |
| 7,493,496 B2 | 2/2009 | Smith et al. |
| 7,498,715 B2 | 3/2009 | Yang |
| 7,511,379 B1 | 3/2009 | Flint |
| 7,514,760 B1 | 4/2009 | Quevy |
| 7,521,783 B2 | 4/2009 | Tsai et al. |
| 7,536,909 B2 | 5/2009 | Zhao et al. |
| 7,585,750 B2 | 9/2009 | Do et al. |
| 7,599,277 B1 | 10/2009 | Kato et al. |
| 7,612,443 B1 | 11/2009 | Bernstein et al. |
| 7,671,478 B2 | 3/2010 | Wathanawasam et al. |
| 7,676,340 B2 | 3/2010 | Yasui |
| 7,690,255 B2 | 4/2010 | Gogoi et al. |
| 7,708,189 B1 | 5/2010 | Cipriano |
| 7,713,785 B1 | 5/2010 | Flint |
| 7,779,689 B2 | 8/2010 | Li et al. |
| 7,814,791 B2 | 10/2010 | Andersson et al. |
| 7,814,792 B2 | 10/2010 | Tateyama et al. |
| 7,814,793 B2 | 10/2010 | Sato |
| 7,861,422 B2 | 1/2011 | McDonald |
| 7,891,103 B2 | 2/2011 | Mayor |
| 8,011,577 B2 | 9/2011 | Mullen et al. |
| 8,016,191 B2 | 9/2011 | Bonalle et al. |
| 8,037,758 B2 | 10/2011 | Sato |
| 8,056,412 B2 | 11/2011 | Rutkiewicz et al. |
| 8,061,049 B2 | 11/2011 | Mayor |
| 8,070,055 B2 | 12/2011 | Block et al. |
| 8,087,296 B2 | 1/2012 | Ueda et al. |
| 8,140,358 B1 | 3/2012 | Ling et al. |
| 8,148,808 B2 | 4/2012 | Braden et al. |
| 8,165,323 B2 | 4/2012 | Zhou |
| 8,181,874 B1 | 5/2012 | Wan et al. |
| 8,227,285 B1 | 7/2012 | Yang |
| 8,236,577 B1 | 8/2012 | Hsu |
| 8,245,923 B1 | 8/2012 | Merrill et al. |
| 8,250,921 B2 | 8/2012 | Nasiri et al. |
| 8,259,311 B2 | 9/2012 | Petschko |
| 8,324,047 B1 | 12/2012 | Yang |
| 8,342,021 B1 | 1/2013 | Oshio |
| 8,367,522 B1 | 2/2013 | Yang |
| 8,395,252 B1 | 3/2013 | Yang |
| 8,395,381 B2 | 3/2013 | Lo |
| 8,402,666 B1 | 3/2013 | Hsu et al. |
| 8,407,905 B1 | 4/2013 | Hsu et al. |
| 8,421,082 B1 | 4/2013 | Yang |
| 8,476,084 B1 | 7/2013 | Yang et al. |
| 8,476,129 B1 | 7/2013 | Jensen et al. |
| 8,477,473 B1 | 7/2013 | Koury et al. |
| 8,486,723 B1 | 7/2013 | Wan et al. |
| 2001/0053565 A1 | 12/2001 | Khoury |
| 2002/0072163 A1 | 6/2002 | Wong et al. |
| 2002/0134837 A1 | 9/2002 | Kishon |
| 2003/0058069 A1 | 3/2003 | Schwartz et al. |
| 2003/0095115 A1 | 5/2003 | Brian et al. |
| 2003/0133489 A1 | 7/2003 | Hirota et al. |
| 2003/0184189 A1 | 10/2003 | Sinclair |
| 2003/0230802 A1 | 12/2003 | Poo et al. |
| 2004/0002808 A1 | 1/2004 | Hashimoto et al. |
| 2004/0016995 A1 | 1/2004 | Kuo et al. |
| 2004/0017644 A1 | 1/2004 | Goodwin-Johansson |
| 2004/0056742 A1 | 3/2004 | Dabbaj |
| 2004/0063325 A1 | 4/2004 | Urano et al. |
| 2004/0104268 A1 | 6/2004 | Bailey |
| 2004/0113246 A1 | 6/2004 | Boon |
| 2004/0119836 A1 | 6/2004 | Kitaguchi et al. |
| 2004/0140962 A1 | 7/2004 | Wang et al. |
| 2004/0177045 A1 | 9/2004 | Brown |
| 2004/0207035 A1 | 10/2004 | Witcraft et al. |
| 2004/0227201 A1 | 11/2004 | Borwick, III et al. |
| 2005/0074147 A1 | 4/2005 | Smith et al. |
| 2005/0090038 A1 | 4/2005 | Wallace |
| 2005/0174338 A1 | 8/2005 | Ing |
| 2005/0199791 A1 | 9/2005 | Sengoku et al. |
| 2005/0247787 A1 | 11/2005 | Von Mueller et al. |
| 2006/0049826 A1 | 3/2006 | Daneman et al. |
| 2006/0081954 A1 | 4/2006 | Tondra et al. |
| 2006/0141786 A1 | 6/2006 | Boezen et al. |
| 2006/0168832 A1 | 8/2006 | Yasui et al. |
| 2006/0192465 A1 | 8/2006 | Kornbluh et al. |
| 2006/0208326 A1 | 9/2006 | Nasiri et al. |
| 2006/0211044 A1 | 9/2006 | Green |
| 2006/0238621 A1 | 10/2006 | Okubo et al. |
| 2006/0243049 A1 | 11/2006 | Ohta et al. |
| 2006/0274399 A1 | 12/2006 | Yang |
| 2007/0046239 A1 | 3/2007 | Hashizume |
| 2007/0132733 A1 | 6/2007 | Ram |
| 2007/0152976 A1 | 7/2007 | Townsend et al. |
| 2007/0181962 A1 | 8/2007 | Partridge et al. |
| 2007/0200564 A1 | 8/2007 | Motz et al. |
| 2007/0281379 A1 | 12/2007 | Stark et al. |
| 2008/0014682 A1 | 1/2008 | Yang et al. |
| 2008/0066547 A1 | 3/2008 | Tanaka et al. |
| 2008/0110259 A1 | 5/2008 | Takeno |
| 2008/0119000 A1 | 5/2008 | Yeh et al. |
| 2008/0123242 A1 | 5/2008 | Zhou |
| 2008/0210007 A1 | 9/2008 | Yamaji et al. |
| 2008/0211043 A1 | 9/2008 | Chen |
| 2008/0211113 A1 | 9/2008 | Chua et al. |
| 2008/0211450 A1 | 9/2008 | Yamada et al. |
| 2008/0277747 A1 | 11/2008 | Ahmad |
| 2008/0283991 A1 | 11/2008 | Reinert |
| 2009/0007661 A1 | 1/2009 | Nasiri et al. |
| 2009/0015251 A1 | 1/2009 | Azumi et al. |
| 2009/0049911 A1 | 2/2009 | Fukuda et al. |
| 2009/0108440 A1 | 4/2009 | Meyer et al. |
| 2009/0115412 A1 | 5/2009 | Fuse |
| 2009/0153500 A1 | 6/2009 | Cho et al. |
| 2009/0262074 A1 | 10/2009 | Nasiri et al. |
| 2009/0267906 A1 | 10/2009 | Schroderus |
| 2009/0307557 A1 | 12/2009 | Rao et al. |
| 2009/0321510 A1 | 12/2009 | Day et al. |
| 2010/0044121 A1 | 2/2010 | Simon et al. |
| 2010/0045282 A1 | 2/2010 | Shibasaki et al. |
| 2010/0071467 A1 | 3/2010 | Nasiri et al. |
| 2010/0075481 A1 | 3/2010 | Yang |
| 2010/0083756 A1 | 4/2010 | Merz et al. |
| 2010/0095769 A1 | 4/2010 | Matsumoto et al. |
| 2010/0109102 A1 | 5/2010 | Chen et al. |
| 2010/0140760 A1* | 6/2010 | Tam et al. .................. 257/660 |
| 2010/0171570 A1 | 7/2010 | Chandrahalim |
| 2010/0208118 A1 | 8/2010 | Ueyama |
| 2010/0236327 A1 | 9/2010 | Mao |
| 2010/0248662 A1 | 9/2010 | Sheynblat et al. |
| 2010/0260388 A1 | 10/2010 | Garrett et al. |
| 2010/0302199 A1 | 12/2010 | Taylor et al. |

(56) References Cited

U.S. PATENT DOCUMENTS

| | | |
|---|---|---|
| 2010/0306117 A1 | 12/2010 | Terayoko |
| 2010/0307016 A1 | 12/2010 | Mayor et al. |
| 2010/0312519 A1 | 12/2010 | Huang et al. |
| 2011/0131825 A1 | 6/2011 | Mayor et al. |
| 2011/0146401 A1 | 6/2011 | Inaguma et al. |
| 2011/0154905 A1 | 6/2011 | Hsu |
| 2011/0172918 A1 | 7/2011 | Tome |
| 2011/0183456 A1 | 7/2011 | Hsieh et al. |
| 2011/0198395 A1 | 8/2011 | Chen |
| 2011/0265574 A1 | 11/2011 | Yang |
| 2011/0266340 A9 | 11/2011 | Block et al. |
| 2011/0312349 A1 | 12/2011 | Forutanpour et al. |
| 2012/0007597 A1 | 1/2012 | Seeger et al. |
| 2012/0007598 A1 | 1/2012 | Lo et al. |
| 2012/0215475 A1 | 8/2012 | Rutledge et al. |

* cited by examiner

METHOD AND STRUCTURE OF SENSORS AND MEMS DEVICES USING VERTICAL MOUNTING WITH INTERCONNECTIONS

CROSS-REFERENCES TO RELATED APPLICATIONS

The present application is a divisional application of U.S. patent application Ser. No. 13/030,871, filed Feb. 18, 2011, which claims priority to U.S. Provisional Pat. App. No. 61/347,805, filed May 24, 2010, and U.S. Provisional Pat. App. No. 61/367,032, filed Jul. 23, 2010, all of which are commonly owned and incorporated by reference herein, for all purposes. The present application also incorporates by reference, for all purposes, the following co-pending patent applications: U.S. patent application Ser. No. 12/859,631, filed Aug. 19, 2010, U.S. patent application Ser. No. 12/490,067, filed Jun. 23, 2009, U.S. patent application Ser. No. 12/945,087, filed Nov. 12, 2010, and U.S. patent application Ser. No. 12/913,440, filed Oct. 27, 2010.

BACKGROUND OF THE INVENTION

Embodiments of the present invention relate generally to integrated devices. In particular, the embodiments of the present invention provide a method and structure for fabricating sensors or electronic devices using vertical mounting with interconnections. More specifically, the embodiments of the present invention provide a method and structure for mounting a sensor/device chip vertically on a substrate and forming interconnections between the chip and the substrate. Merely by way of example, the sensor(s) or electronic device(s) can include ordinary magneto-resistive (OMR) device(s), anisotropic magneto-resistive (AMR) devices, giant magneto-resistive (GMR) device(s), tunnel junction magneto-resistive (TMR), or others. Additionally, other applications include at least one sensor application or magnetic field sensing applications, system applications, among others. But it will be recognized that the invention has a much broader range of applicability.

Research and development in integrated microelectronics have continued to produce astounding progress in CMOS, magnetic field sensors, and MEMS. CMOS technology has become the predominant fabrication technology for integrated circuits (IC). In layman's terms, microelectronic ICs are the "brains" of an integrated device which provides decision-making capabilities, whereas MEMS, magnetic field sensors, and others, are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC, magnetic field sensing, and MEMS technology has limitless applications through modular measurement devices such as accelerometers, angular rate sensors, transducers, actuators, and other sensors and devices. In conventional vehicles, accelerometers and angular rate sensors are used to deploy airbags and trigger dynamic stability control functions, respectively. Magnetic sensors are commonly used in compass systems, such as those used in aircrafts to determine heading, pitch and roll. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. Magnetic sensors have also been used in applications requiring proximity switching, positioning, speed detection, and current sensing. As described previously, ICs, magnetic field sensors, and MEMS can be used to practically engage in various type of environmental interaction.

Although highly successful, ICs and in particular magnetic field sensors and MEMS still have limitations. Similar to IC development, magnetic sensor and MEMS development, which focuses on increasing performance, reducing size, and decreasing cost, continues to be challenging. Additionally, applications of magnetic sensors and MEMS often require increasingly complex microsystems that desire greater computational power. Unfortunately, such devices generally do not exist. These and other limitations of conventional magnetic sensors, MEMS, and ICs may be further described throughout the present specification and more particularly below.

From the above, it is seen that techniques for improving operation of integrated circuit devices, magnetic field sensors, and MEMS are highly desired.

BRIEF SUMMARY OF THE INVENTION

According to the embodiments of the present invention, techniques related generally to integrated devices and systems are provided. In particular, the embodiments of the present invention provide a method and structure for fabricating sensors or electronic devices using vertical mounting with interconnections. More specifically, the embodiments of the present invention provide a method and structure for mounting a sensor/device chip vertically on a substrate and forming interconnections between the chip and the substrate. Merely by way of example, the sensor(s) or electronic device(s) can include ordinary magneto-resistive (OMR) device(s), anisotropic magneto-resistive (AMR) devices, giant magneto-resistive (GMR) device(s), tunnel junction magneto-resistive (TMR), or others. Additionally, the other applications include at least one sensor application or applications, system applications, and broadband applications, among others. But it will be recognized that the invention has a much broader range of applicability.

A specific embodiment provides a method and structure for fabricating sensor(s) or electronic device(s) using vertical mounting with interconnections. The method includes providing a resulting device including at least one sensor or electronic device, formed on a die member, having contact region(s) with one or more conductive materials formed thereon. The resulting device can then be singulated within a vicinity of the contact region(s) to form one or more singulated dies, each having a singulated surface region. The singulated die(s) can be coupled to a substrate member, having a substrate surface region, such that the singulated surface region(s) of the singulated die(s) are coupled to a portion of the substrate surface region. Interconnections can be formed between the die(s) and the substrate member with conductive adhesives, solder processes, or other conductive bonding processes.

Many benefits are achieved by way of several embodiments of the present invention over conventional techniques. For example, the present technique provides an easy way to integrate a z-axis magnetic field sensor on a single package as X-Y axis sensors. Additionally, the method provides a process and system that are compatible with conventional semiconductor and MEMS process technology without substantial modifications to conventional equipment and processes. Preferably, the embodiments of the invention provide for an improved magnetic sensor and MEMS device system and related applications for a variety of uses. In one or more embodiments, sensors, MEMS and related applications, may be integrated on one or more CMOS device structures. Depending upon the embodiment, one or more of these benefits may be achieved. These and other benefits will be described in more throughout the present specification and more particularly below.

Various additional features and advantages of the embodiments of the present invention can be more fully appreciated with reference to the detailed description and accompanying drawings that follow

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

According to embodiments of the present invention, techniques related generally to integrated devices and systems are provided. In particular, the embodiments of the present invention provide a method and structure for fabricating sensors or electronic devices wherein one or more components may be vertically mounted (e.g. orthogonal to a substrate). More specifically, the embodiments of the present invention provide a method and structure for mounting a sensor/device chip vertically on a substrate and forming interconnections between the chip and the substrate. Merely by way of example, the sensors or integrated electronic devices can include at least an accelerometer, a gyroscope, a magnetic sensor, a pressure sensor, a microphone, a humidity sensor, a temperature sensor, a chemical sensor, a biosensor, an inertial sensor, and others. Also, the sensor(s) or electronic device(s) can include ordinary magneto-resistive (OMR) device(s), anisotropic magneto-resistive (AMR) devices, giant magneto-resistive (GMR) device(s), tunnel junction magneto-resistive (TMR), or others. Additionally, the other applications include at least a sensor application or applications, system applications, and broadband applications, among others. But it will be recognized that the embodiments of the invention has a much broader range of applicability.

Figure 1:
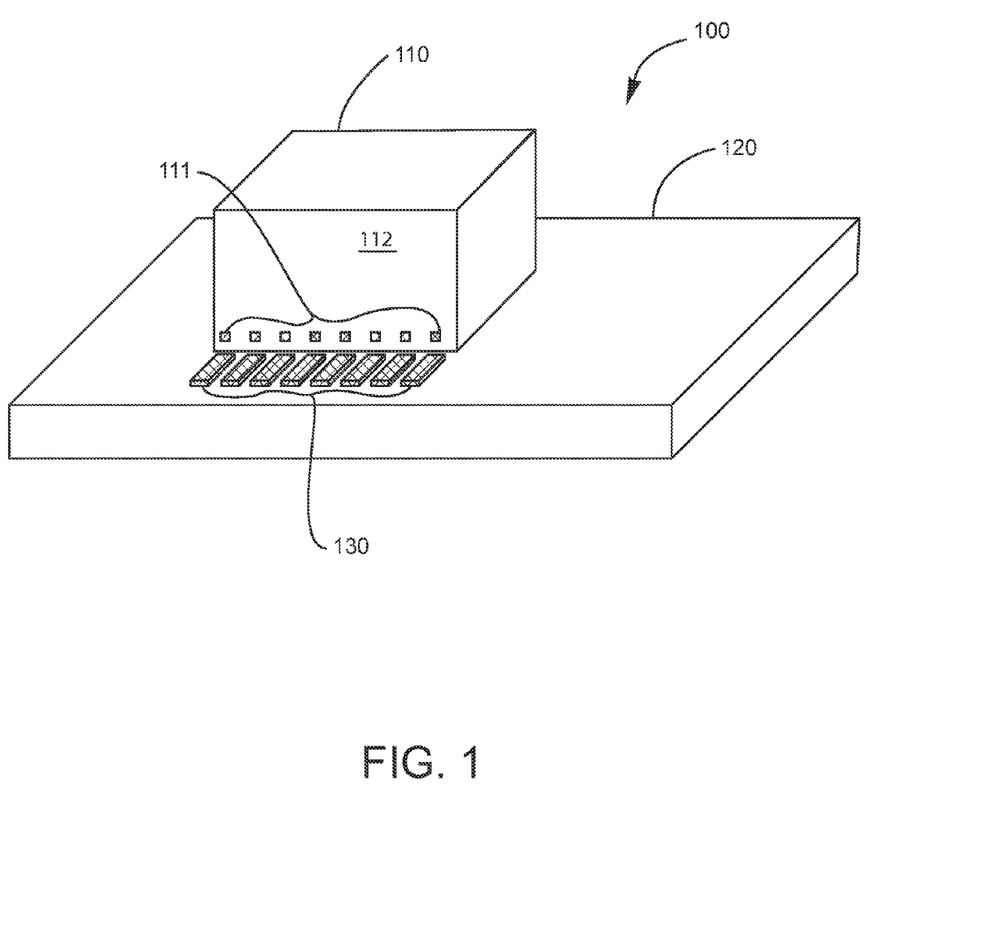
FIG. 1 is a simplified diagram illustrating a perspective view of an integrated sensor or electronic device according to an embodiment of the present invention.

FIG. 1 is a simplified diagram illustrating a perspective view of an integrated sensor device or electronic device according to an embodiment of the present invention. This diagram is merely an example, which should not unduly limit the scope of the claims herein. One of ordinary skill in the art would recognize many other variations, modifications, and alternatives. As shown, device 100 includes a singulated die member 110 and a substrate member 120. Device 100 shown in this figure can represent an integrated sensor device or electronic device without formed interconnections. Those skilled in the art will recognize other variations, modifications, and alternatives.

In a specific embodiment, die member 110 can include a semiconductor die having a buried oxide (BOX) substrate or an epitaxial (EPI) substrate. Die member 110 can also include substrate packaging, printed circuit board (PCB), or lead frame packaging materials. Also, die member 110, as used herein, can include a plastic, coated plastic, metal, metal alloy, or other material and combination thereof. In further embodiments, die member 110 can have a silicon, single crystal silicon, or polycrystalline silicon material. Those skilled in the art will recognize other variations, modifications, and alternatives.

In an embodiment, die member 110 can have a first surface region 112, as shown in FIG. 1. In an embodiment, at least one sensor or electronic device can be formed overlying at least one portion of the first surface region 112. In some embodiments, first surface region 112 may have an area of about 600 um by 800 um for a particular semiconductor die, but the area can vary depending on the devices included in the die. In certain embodiments, the thickness of the die may be about 600 um for a semiconductor die. Of course, these dimensions can vary depending on the die substrate, or packaging, or circuit board involved. In a specific embodiment, the sensor(s) or electronic device(s) can include transistor devices, metal layers, via structures, and others. The sensor(s) or electronic device(s) can also include a conduction material, a metal material, a metal alloy material, an insulating material, a dielectric material, or other materials or combinations thereof. Additionally, the sensor(s) or electronic device(s) can include integrated CMOS circuit devices, MEMS devices, magneto-resistive devices, or other devices or combinations thereof. In specific embodiments, the magneto-resistive devices can include anisotropic magneto-resistive (AMR), ordinary magneto-resistive (OMR), giant magneto-resistive (GMR), tunnel junction magneto-resistive (TMR) devices, or other devices and combinations thereof. In further embodiments, additional transistors, metal layers, and structures can be added. The sensor(s) or electronic device(s) can have at least one contact region 111. Contact region(s) 111 can include bond pad(s), bonding structure(s), metalized pads, or conductive region(s), as well as others. In various embodiments, the device(s) can be covered with a passivation/dielectric material with openings above the contact region(s). Contact region(s) 111 can configured on 80 um pitch with 60 um passivation openings. The fabrication of sensor(s) or electronic device(s) can be done through foundry-compatible processes. Of course, there can be other variations, modifications, and alternatives.

In an embodiment, substrate member 120 can have a second surface region. In a specific embodiment, substrate member 120 can be a buried oxide (BOX) substrate or an epitaxial (EPI) substrate. Substrate member 120 can also include land grid array (LGA), ball grid array (BGA), and pin grid array (PGA) packaging materials. Also, substrate member 120 can include a plastic, coated plastic, metal, metal alloy, or other material and combination thereof. Substrate member 120 can have at least one contact region 130. Contact region(s) 130 can include bond pad(s), bonding structure(s), metalized pads, or conductive region(s), as well as others. In a specific embodiment, contact region(s) 130 can have a width of 40 um with 40 um spacing between each contact region 130. In various embodiments, substrate member 120 can have a silicon, single crystal silicon, or polycrystalline silicon material. Those skilled in the art will recognize other variations, modifications, and alternatives.

Many benefits are achieved by way of several embodiments of the present invention over conventional techniques. For example, the present technique provides an easy way to integrate a z-axis sensor (e.g. z-axis magnetic sensor) on a single package as X-Y axis sensors (e.g. x-y axis magnetic sensors). Additionally, the method provides a process and system that are compatible with conventional semiconductor and MEMS process technology without substantial modifications to conventional equipment and processes. Preferably, the embodiments of the invention provide for an improved magnetic sensor and MEMS device system and related applications for a variety of uses. In one or more embodiments, sensors, MEMS and related applications, may be integrated on one or more CMOS device structures. Depending upon the embodiment, one or more of these benefits may be achieved. These and other benefits will be described in more throughout the present specification and more particularly below.

It is also understood that the examples and embodiments described herein are for illustrative purposes only and that various modifications or changes in light thereof will be suggested to persons skilled in the art and are to be included within the spirit and purview of this application and scope of the appended claims.

Figure 2:
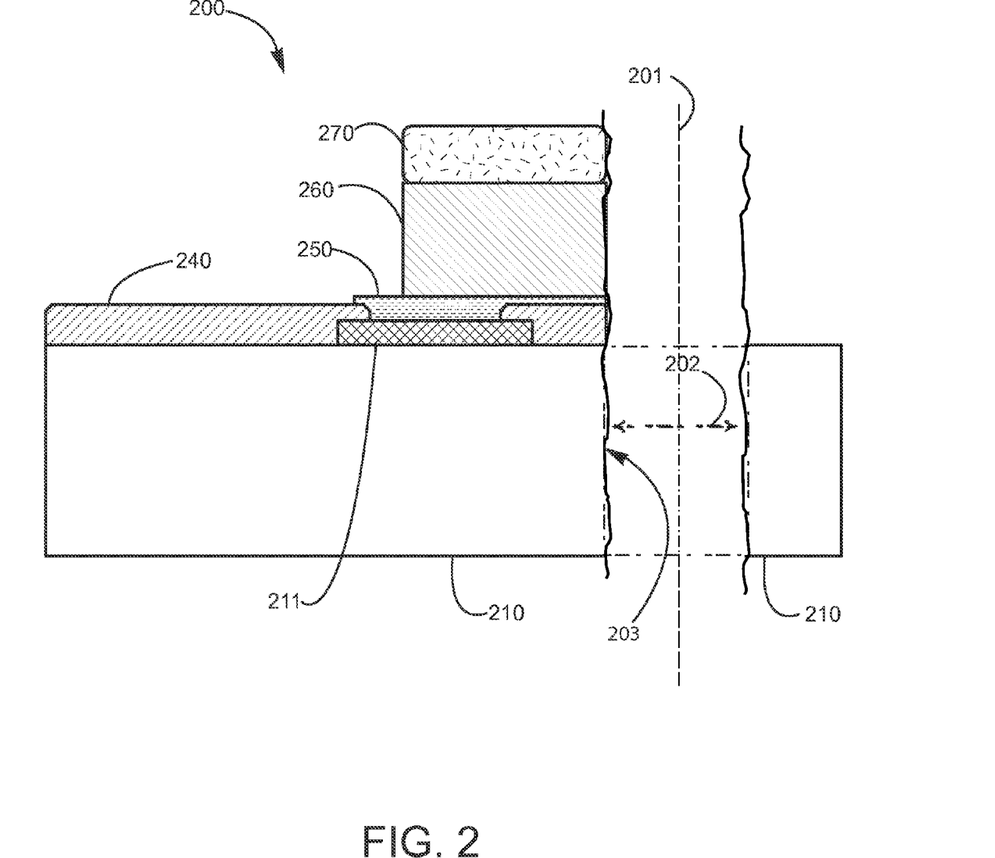
FIG. 2 is a simplified diagram illustrating a cross-sectional diagram of a sensor device or electronic device according to an embodiment of the present invention.

FIG. 2 is a simplified diagram illustrating a cross-sectional view of an integrated sensor device or electronic device according to an embodiment of the present invention. This diagram is merely an example, which should not unduly limit the scope of the claims herein. One of ordinary skill in the art would recognize many other variations, modifications, and alternatives. As shown, device 200 includes a singulated die member 210, first conductive material(s) 250, second conductive material(s) 260, and solder material(s) 270. Device 200 shown in this figure can represent an integrated sensor device or electronic device prior to vertical mounting. A detailed description regarding a portion of the structure and or more elements device 200 can be found above in the description for FIG. 1. Those skilled in the art will recognize other variations, modifications, and alternatives.

In an embodiment, die member 210, which can have at least one contact region 211, can have a passivation layer 240 formed thereon. Passivation layer 240 can be opened to reveal contact region(s) 211. First conductive material(s) 250 can be formed overlying at least contact region(s) 211. First conductive material(s) 250 can include metal materials, metal alloys, conductive adhesives, and other conductive materials and combinations thereof. First conductive material(s) 250, which can be formed via a sputtering or like process, can also be a redistribution layer (RDL). In various embodiments, first conductive material(s) 250 can be metalized and patterned such that the electrically connectivity of contact region(s) 211 is extended to one or more regions of the surface area of die member 210. In a specific embodiment, first conductive material(s) 250 can cover the exposed portion of contact region(s) 211 and extend the electric connectivity such that second conductive material(s) 260 can be formed thereon. Second conductive material(s) 260 can be formed overlying one or more portions of first conductive material(s) 250. Second conductive material(s) 260, which can also include metal materials, metal alloys, conductive adhesives or other conductive materials, can be metal bumps formed by standard bump metallization processes for semiconductor devices. The metal materials used in first conductive material(s) 250 and second conductive material(s) 260 can include copper (Cu), gold (Au), tin (Sn), silver (Ag), or other metal elements and combinations thereof. Those skilled in the art will recognize other variations, modifications, and alternatives.

In an embodiment, solder material(s) 270 can be formed overlying at least second conductive material(s) 260. Solder material(s) 270 can include one or more metal elements, such as those mentioned above for the conductive materials. In a specific embodiment, solder material(s) 270 can include a tin-silver (SnAg) alloy in a paste form. Solder material(s) 270 can be applied via a sputtering process, or like process, or a mechanical process. In various embodiments, conductive materials 250, 260 and solder material(s) 270 can be used to extend the electrical connectivity of the die to another surface without the use of wire interconnections. For vertically mounted devices, singulation of the die may be necessary. In those cases, die member 210 may be cut along line 201 with a saw kerf 202. Conductive materials 250, 260, and solder material(s) 270 can be trimmed by the saw due to the width of the kerf, or the saw cut can avoid the shown materials altogether. Die member 210 can be singulated, forming a singulated die with a singulated surface region 203 on the side of the cut. In some embodiments, the singulated surface region 203 on the side of the singulated die member is used for mounting the die member vertically on a substrate, to be described in detail below. In some embodiments in which the singulated surface region 203 is disposed on a surface of the substrate, conductive materials are 260 is in contact with a conductive material on a substrate, and solder material 270 is used for securing the singulated die member to the substrate. Of course, there can be variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
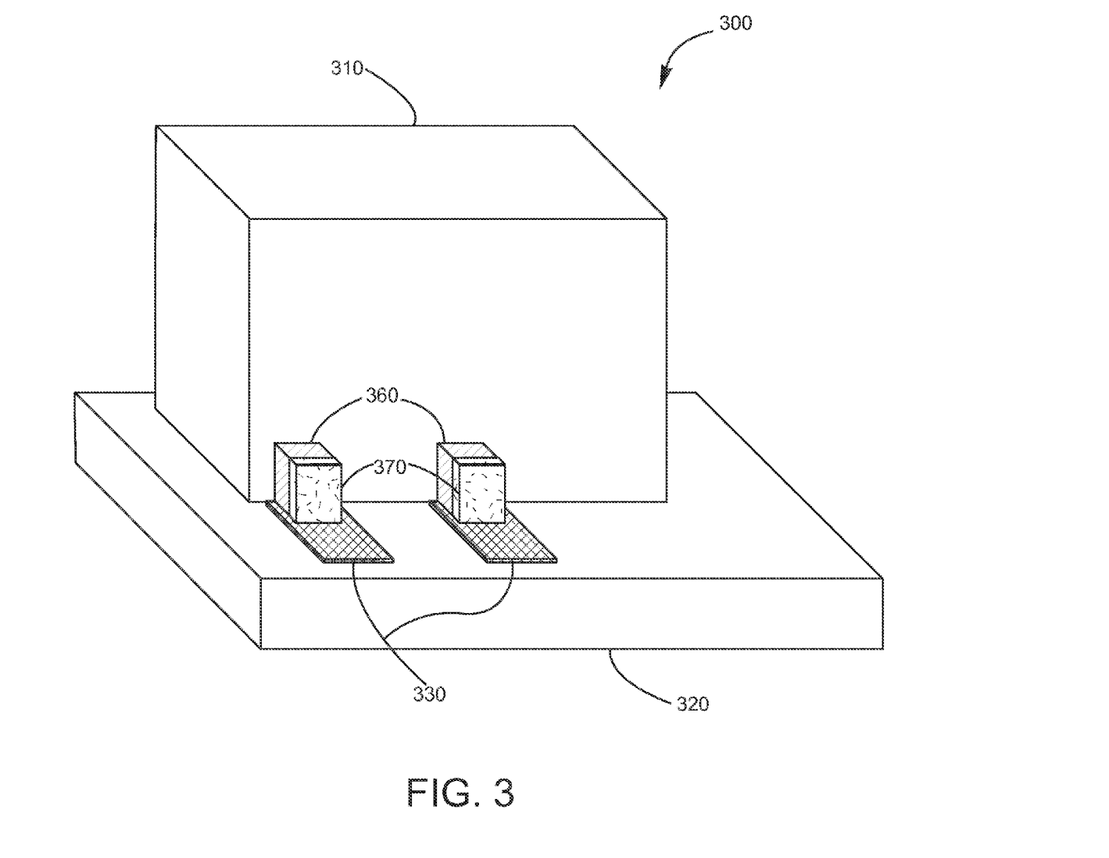
FIG. 3 is a simplified diagram illustrating a perspective view of a sensor device or electronic device according to an embodiment of the present invention.

FIG. 3 is a simplified diagram illustrating a perspective view of an integrated sensor device or electronic device according to an embodiment of the present invention. This diagram is merely an example, which should not unduly limit the scope of the claims herein. One of ordinary skill in the art would recognize many other variations, modifications, and alternatives. As shown, device 300 includes a singulated die member 310 mounted on a substrate member 320 with contact region(s) 330, second conductive material(s) 360, and solder material(s) 370. Device 300 shown in this figure can represent an embodiment of a vertically mounted integrated sensor device or electronic device. A detailed description regarding a portion of the structure and or more elements device 300 can be found above in the description for FIG. 1 and FIG. 2. Those skilled in the art will recognize other variations, modifications, and alternatives.

In an embodiment, the singulated die 310 can be mounted vertically on substrate member 320. The singulated surface region of die 310 can be coupled to at least a portion of the surface region of substrate member 320. Second conductive material(s) 360 (corresponding to conductive material 260) and solder material(s) 370 (corresponding to solder material 270) can be coupled to the contact region(s) of substrate member 320. In a specific embodiment, the coupling can be achieved via a conductive adhesive, solder reflow, or the like. Of course, there can be variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4:
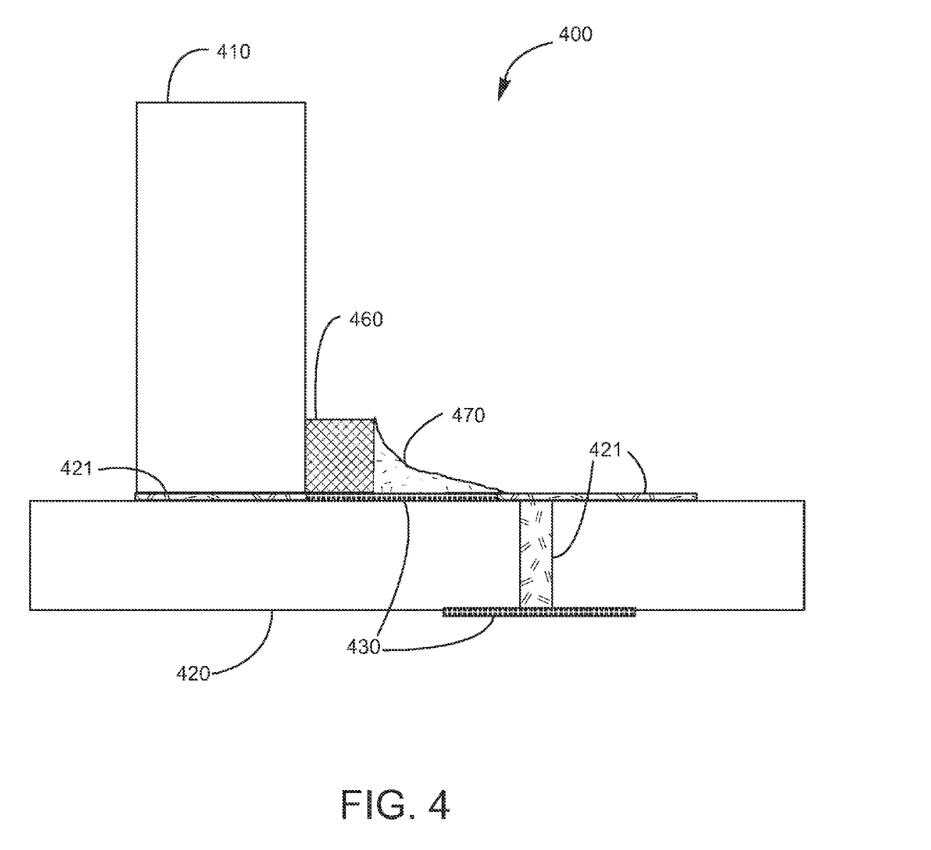
FIG. 4 is a simplified diagram illustrating a cross-sectional view of a sensor device or electronic device according to an embodiment of the present invention.

FIG. 4 is a simplified diagram illustrating a cross-sectional view of an integrated sensor device or electronic device according to an embodiment of the present invention. This diagram is merely an example, which should not unduly limit the scope of the claims herein. One of ordinary skill in the art would recognize many other variations, modifications, and alternatives. As shown, device 400 includes a singulated die member 410, second conductive material(s) 460 (corresponding to conductive material 260), and solder material(s) 470 (corresponding to solder 270). Device 400 shown in this figure can represent an embodiment of a vertically mounted integrated sensor device or electronic device. A detailed description regarding a portion of the structure and or more elements device 400 can be found above in the description for FIG. 1 and FIG. 2. Those skilled in the art will recognize other variations, modifications, and alternatives.

In an embodiment, the substrate layer can have insulation materials 421 formed overlying one or more portions of the surface region of substrate member 420 and/or one or more portions within substrate member 420. Insulation materials 421, which can include passivation materials or dielectric materials, can have openings for contact region(s) 430. Singulated die member 410 can be coupled to at least a portion of insulation material 421. Those skilled in the art will recognize other variations, modifications, and alternatives.

In a specific embodiment, solder material(s) 470 can be reflowed to cover one or more portions of contact region(s) 430. Solder material(s) 470 can be subjected to a controlled heat, which can melt and solidify the connections between singulated die 410 and substrate member 420. The reflow process can be achieved via a reflow oven, an infrared lamp, hot air pencil, or other heating process. Of course, there can be variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5:
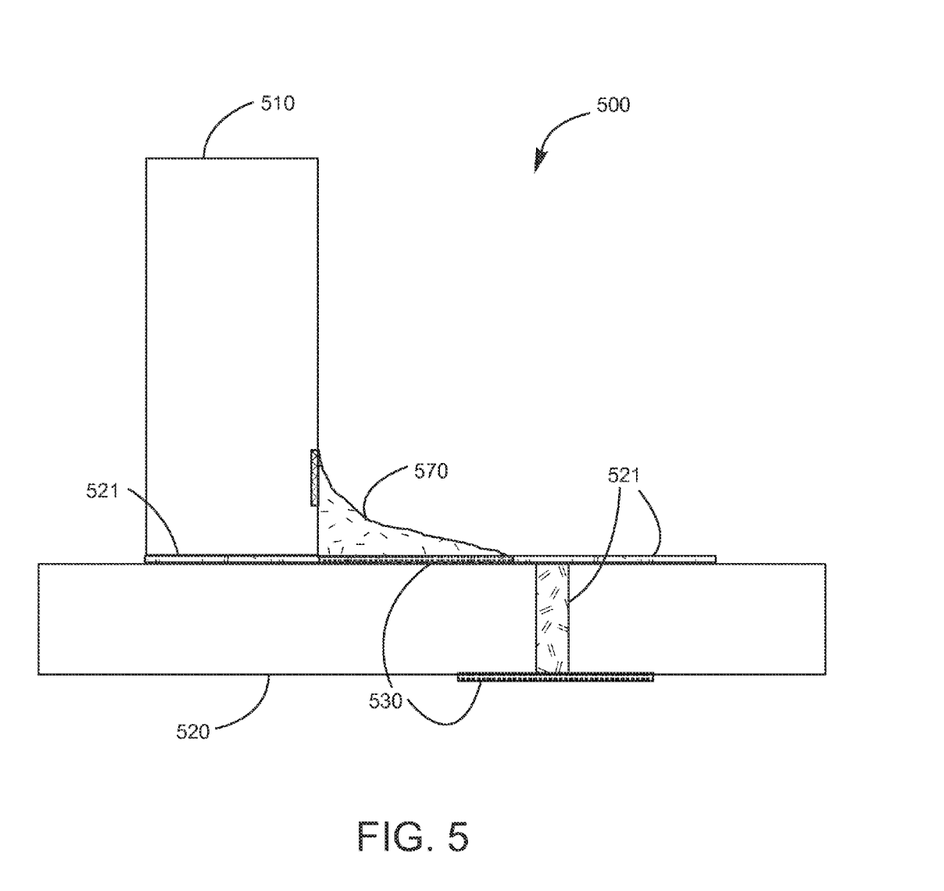
FIG. 5 is a simplified diagram illustrating a cross-sectional view of a sensor device or electronic device according to an embodiment of the present invention.

FIG. 5 is a simplified diagram illustrating a cross-sectional view of an integrated sensor device or electronic device according to an embodiment of the present invention. This diagram is merely an example, which should not unduly limit the scope of the claims herein. One of ordinary skill in the art would recognize many other variations, modifications, and alternatives. As shown, device 500 includes a singulated die member 510 mounted on a substrate member 520 with contact region(s) 530 and insulation material 521, and solder material(s) 570 (corresponding to solder 270). Device 500 shown in this figure can represent an embodiment of a vertically mounted integrated sensor device or electronic device. A detailed description regarding a portion of the structure and or more elements device 500 can be found above in the description for FIGS. 1, 2, and 4. Those skilled in the art will recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 6:
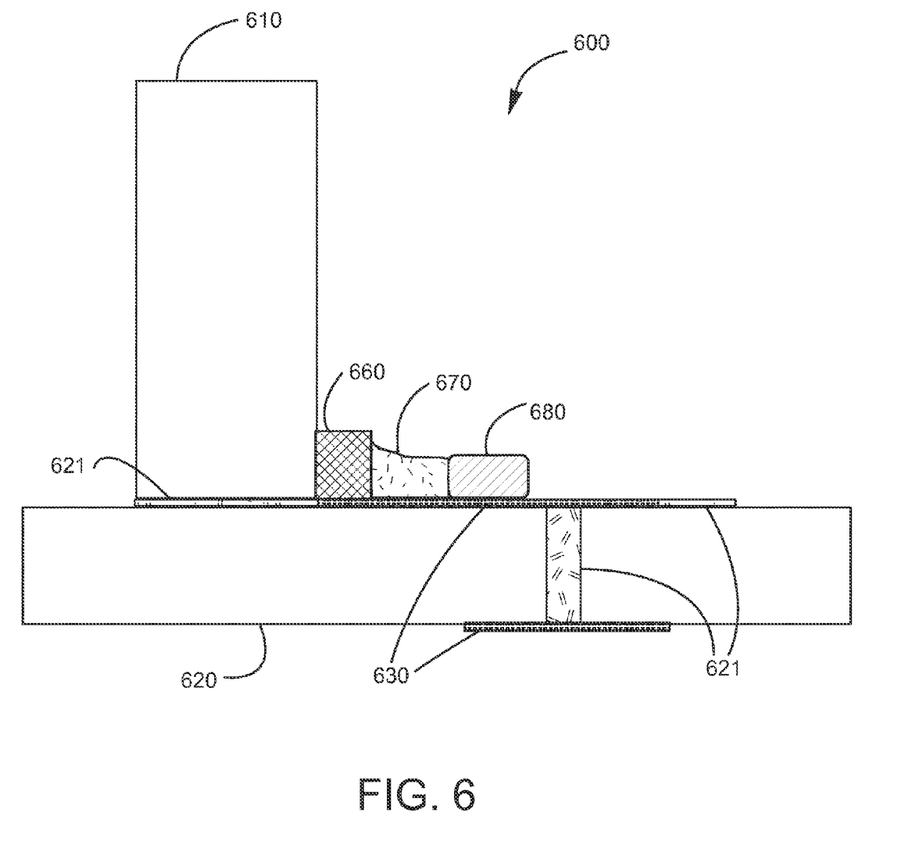
FIG. 6 is a simplified diagram illustrating a cross-sectional view of a sensor device or electronic device according to an embodiment of the present invention.

FIG. 6 is a simplified diagram illustrating a cross-sectional view of an integrated sensor device or electronic device according to an embodiment of the present invention. This diagram is merely an example, which should not unduly limit the scope of the claims herein. One of ordinary skill in the art would recognize many other variations, modifications, and alternatives. As shown, device 600 includes a singulated die member 610 mounted on a substrate member 620 with contact region(s) 630, second conductive material(s) 660 (corresponding to conductive material(s) 260) and solder material(s) 670 (corresponding to solder 270). Device 600 may also include insulation materials 621 and third conductive material(s) 680. Device 600 shown in this figure can represent an integrated sensor device or electronic device having a vertically mounted device (on a singulated die member 610). A detailed description regarding a portion of the structure and or more elements of device 600 can be found above in the description for FIGS. 1, 2, and 4. Those skilled in the art will recognize other variations, modifications, and alternatives.

In an embodiment, third conductive material(s) 680 can be formed overlying at least a portion of contact region(s) 630 of substrate member 620. Third conductive material(s) 680 can include similar materials as described previously for the first or second conductive materials. In a specific embodiment, third conductive material(s) 680 can be a metalized bump formed by a similar process as described for second conductive material(s) 660. The bump can serve as an end stop for the solder reflow process, shaping solder material(s) 670 during the heating process. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 7:
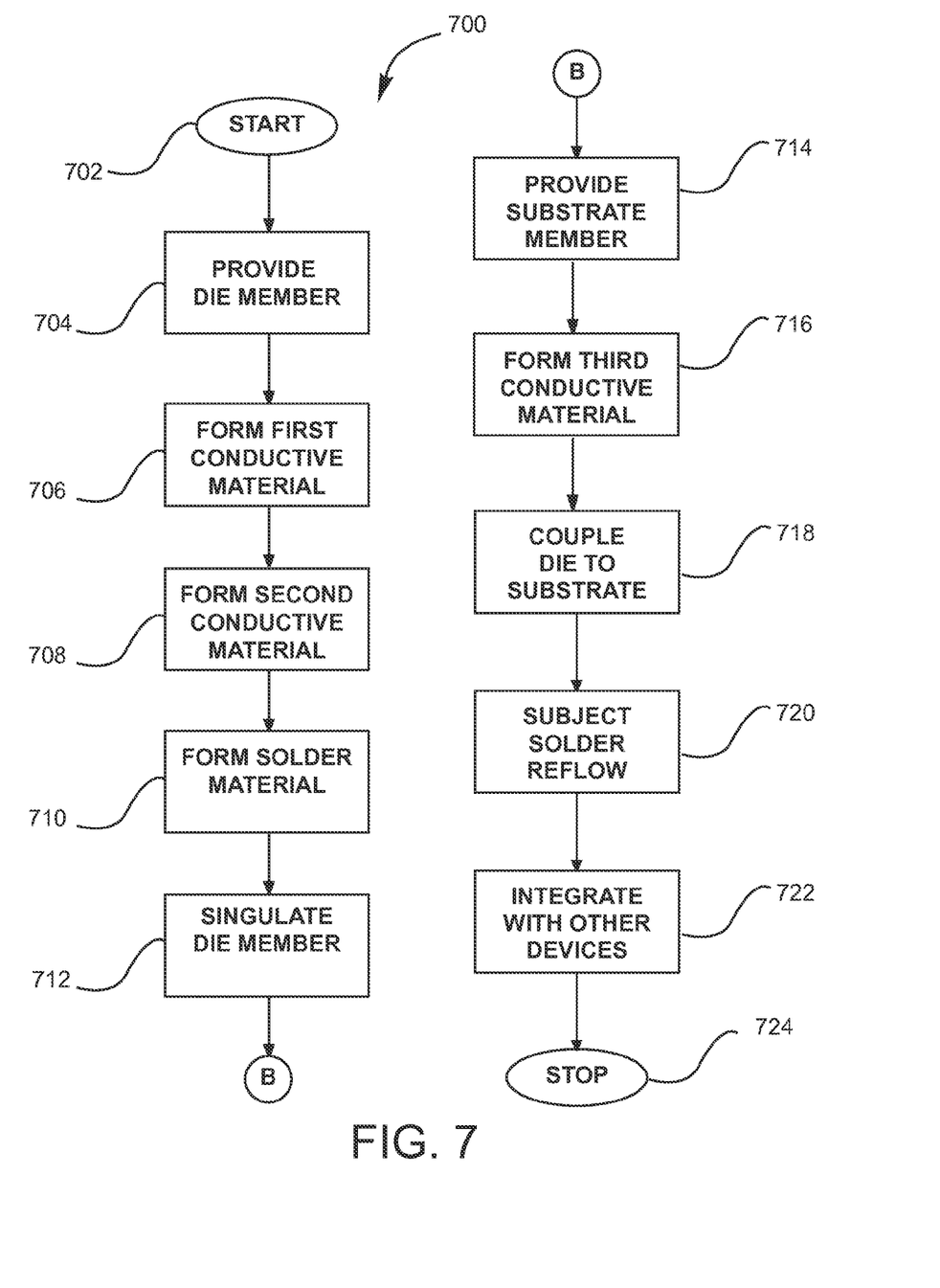
FIG. 7 is a simplified diagram illustrating a flow chart of a method for fabricating sensors or electronic devices according to an embodiment of the present invention.

FIG. 7 is a simplified flow diagram illustrating a method of fabricating sensors or electronic devices using vertical mounting with interconnections according to an embodiment of the present invention.

As shown in FIG. 7, an embodiment of the present method can be briefly outlined below.

1. Start;
2. Provide a die member having contact region(s);
3. Form first conductive material(s) overlying the die contact region(s);
4. Form second conductive material(s) overlying the first conductive material(s);
5. Form solder material(s) overlying the second conductive material(s);
6. Singulate die member forming singulated die(s);

7. Provide substrate member having contact region(s);

8. Form third conductive material(s) overlying substrate contact region(s);

9. Couple singulated die(s) to substrate to form vertically mounted device(s);

10. Subject vertically mounted device(s) to a solder reflow process;

11. Integrated vertically mounted device(s) with other device(s); and

12. Stop.

These steps are merely examples and should not unduly limit the scope of the claims herein. As shown, the above embodiment of a method provides a way of fabricating an integrated electronic device using vertical mounting with interconnections according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 7, method 700 begins at start, step 702. Embodiments of the present method provide a fabrication method for forming an integrated electronic device using vertical mounting with interconnections. Many benefits are achieved by way of several embodiments of the present invention over conventional techniques. For example, the present techniques provide an easy way to integrate a z-axis sensor (e.g. z-axis magnetic field sensor) on a single package including X-Y axis sensors (e.g. x-y axis magnetic field sensor). Additionally, embodiments provide processes and systems that are compatible with conventional semiconductor and MEMS process technology, without substantial modifications to conventional equipment and processes. Some embodiments of the invention provide for an improved magnetic sensor and MEMS device system and related applications for a variety of uses. In one or more embodiments, the embodiments of the present invention provides for some or all physical sensors, MEMS and related applications, which may be integrated on one or more CMOS device structures. Depending upon the embodiment, one or more of these benefits may be achieved.

Following step 702, fabrication method 700 involves providing a die member having a first surface region, step 704. In a specific embodiment, the die member can be a buried oxide (BOX) substrate or an epitaxial (EPI) substrate. The die member can also include substrate packaging, printed circuit board (PCB), or lead frame packaging materials. Also, the die member can include a plastic, coated plastic, metal, metal alloy, or other material and combination thereof. In further embodiments, the die member can have a silicon, single crystal silicon, or polycrystalline silicon material. Those skilled in the art will recognize other variations, modifications, and alternatives.

In an embodiment, the die member can have a first surface region. At least one sensor or electronic device can be formed overlying at least one portion of the first surface region. In a specific embodiment, the one sensor(s) or electronic device(s) can include transistor devices, metal layers, via structures, and others. The sensor(s) or electronic device(s) can also include a conduction material, a metal material, a metal alloy material, an insulating material, a dielectric material, or other materials or combinations thereof. Additionally, the sensor(s) and electronic device(s) can include integrated CMOS circuit devices, MEMS devices, magneto-resistive devices, or other devices or combinations thereof. The magneto-resistive devices can include anisotropic magneto-resistive (AMR), ordinary magneto-resistive (OMR), giant magneto-resistive (GMR), or tunnel junction magneto-resistive (TMR) devices. In further embodiments, additional transistors, metal layers, and structures can be added. The sensor(s) or electronic device(s) can have one or more contact regions. The contact region(s) can include at least one bond pad, bonding structure, or conductive region, as well as others. The fabrication of the sensor(s) or electronic device(s) can be done through foundry-compatible processes. Of course, there can be other variations, modifications, and alternatives.

In an embodiment, the die member, which can have at least one contact region, can have a passivation layer formed thereon. The passivation layer can be opened to reveal the contact region(s). At least one first conductive material can be formed overlying at least the contact region(s), step 706. The first conductive material(s) can include metal materials, metal alloys, conductive adhesives, and other conductive materials and combinations thereof. The first conductive material(s), which can be formed via a sputtering or like process, can also be a redistribution layer (RDL). In various embodiments, the first conductive material(s) can be metalized and patterned such that the electrically connectivity of the contact region(s) is extended to one or more regions of the surface area of die member. In a specific embodiment, the first conductive material(s) can cover the exposed portion of the contact region(s) and extend the electric connectivity such that at least one second conductive material can be formed thereon, step 708. The second conductive material(s) can be formed overlying one or more portions of the first conductive material(s). The second conductive material(s), which can also include metal materials, metal alloys, conductive adhesives or other conductive materials, can be metal bumps formed by standard bump metallization processes for semiconductor devices. The metal materials used in the first conductive material(s) and the second conductive material(s) can include copper (Cu), gold (Au), tin (Sn), silver (Ag), or other metal elements and combinations thereof. Those skilled in the art will recognize other variations, modifications, and alternatives.

In an embodiment, at least one solder material can be formed overlying at least the second conductive material, step 710. The solder material(s) can include one or more metal elements, such as those mentioned above for the conductive materials. In a specific embodiment, the solder material(s) can include a tin-silver (SnAg) alloy in a paste form. The solder material(s) can be applied via a sputtering process, or like process, or a mechanical process. In various embodiments, the conductive materials and the solder material(s) can be used to extend the electrical connectivity of the die to another surface without the use of wire interconnections. For vertically mounted devices, singulation of the die may be necessary, step 712. In those cases, the die member may be cut along a line with a saw kerf within a vicinity of the die contact region(s). The conductive materials and the solder material(s) can be trimmed by the saw due to the width of the kerf, or the saw cut can avoid the shown materials altogether. The die member can be singulated, forming at least one singulated die with a singulated surface region on the side of the cut. The angle of the cut is typically perpendicular to the plane of the die. In an embodiment, the singulation process can include a dicing, an etching, or a laser scribing process. Of course, there can be variations, modifications, and alternatives.

In an embodiment, substrate member with a second surface region can be provided, step 714. In a specific embodiment, the substrate member can be a buried oxide (BOX) substrate or an epitaxial (EPI) substrate. The substrate member can also include land grid array (LGA), ball grid array (BGA), and pin grid array (PGA) packaging materials. Also, the substrate member can include a plastic, coated plastic, metal, metal alloy, or other material and combination thereof. The substrate member can have at least one contact region. The contact region(s) of the substrate member can include bond pad(s), bonding structure(s), metalized pads, or conductive region(s), as well as others. Contact regions may be electrically coupled to one or more circuits formed upon the substrate. For example, the one or more circuits may include the x-y sensors (e.g. x-y magnetic sensors), described above. In a specific embodiment, the contact region(s) can have a width of 40 um with 40 um spacing between each contact region. In various embodiments, the substrate member can have a silicon, single crystal silicon, or polycrystalline silicon material. Those skilled in the art will recognize other variations, modifications, and alternatives.

In an embodiment, at least one third conductive material can be formed overlying at least a portion of the contact region(s) of the substrate member, step 716. The third conductive material(s) can include similar materials as described previously for the first and second conductive materials. In a specific embodiment, the third conductive material(s) can be a metalized bump formed by a similar process as described for the second conductive material(s). The bump can serve as an end stop for the solder reflow process, shaping the solder material during the heating process. Of course, there can be other variations, modifications, and alternatives.

At least one singulated device(s) can be coupled to the substrate member, step 718. In an embodiment, the singulated die(s) can be mounted vertically, orthogonally, at right angles, or the like on the substrate member. The singulated surface region of the singulated die(s) can be coupled to at least a portion of the surface region of the substrate member. The second conductive materials and solder material(s) can be coupled to the contact region(s) of the substrate member. In a specific embodiment, the physical coupling can be achieved via a conductive adhesive, e.g. epoxy, or the like. Again, those skilled in the art will recognize other modifications, variations, and alternatives.

Once the singulated die(s) are mounted on the substrate member, the solder material can be subjected to a solder reflow process to cover one or more portions of the contact region(s) of the substrate member, step 720. The solder material can be subjected to a controlled heat, which can melt and solidify the connections between the singulated die and the substrate member. The reflow process can be achieved via a reflow oven, an infrared lamp, hot air pencil, or other heating process. In various embodiments, additional MEMS devices or sensors can be integrated with the vertically mounted device(s), step 722. Further integration with additional devices can contribute to multi-axial or multi-functional designs. These kinds of integrated designs can decrease chip size while improving chip performance. Of course, there can be other variations, modification, and alternatives that would be recognized by those skilled in the art.

The above sequence of processes provides a fabrication method for forming sensors or electronic devices using vertical mounting with interconnections according to an embodiment of the present invention. As shown, the embodiment of the method uses a combination of steps including providing a die member, forming one or more conductive materials overlying portions of the die member, singulating the die member, providing a substrate member, and mounting the singulated die member on the substrate member. Other alternatives can also be provided where steps are added, one or more steps are removed, or one or more steps are provided in a different sequence without departing from the scope of the claims herein. Further details of the present method can be found throughout the present specification.

What is claimed is:

1. An integrated sensor device or electronic device, the device comprising:
    a substrate member having a first surface region, the substrate member having at least one contact region;
    at least one singulated integrated sensor or electronic device each coupled to a die member, each die member having a singulated surface region and at least one contact region, the singulated surface region(s) being coupled to the first surface region;
    at least one first conductive material formed overlying at least the contact region(s) of the singulated integrated sensor or electronic device; and
    at least one second conductive material formed overlying at least a portion of the first conductive material(s).

2. The device of claim 1 further comprising at least one solder material formed overlying at least a portion the second conductive material(s).

3. The device of claim 2 wherein the solder material(s) comprises tin (Sn), silver (Ag), or a tin-silver alloy (SnAg).

4. The device of claim 2 wherein the solder material(s) are reflowed solder material(s).

5. The device of claim 2 further comprising forming at least one third conductive material overlying at least a portion of the contact region(s) of the substrate member.

6. The device of claim 5 wherein the first, second, and third conductive material(s) comprise one or more metal materials selected from a group consisting of: copper (Cu), gold (Au), silver (Ag), and tin (Sn).

7. The device of claim 5 wherein the third conductive material(s) comprise silver-filled epoxies, interposers, redistribution layers (RDLs), or metal bumps.

8. The device of claim 1 wherein the sensor(s) or electronic device(s) comprise CMOS integrated circuit device(s), MEMS device(s), magneto-resistive device(s), or integrated MEMS-CMOS device(s).

9. The device of claim 1 wherein the magneto-resistive device(s) comprise anisotropic magneto-resistive (AMR), ordinary magneto-resistive (OMR), giant magneto-resistive (GMR), or tunnel junction magneto-resistive (TMR) device(s).

10. The device of claim 1 wherein the first conductive material(s) comprise silver-filled epoxies, interposers, redistribution layers (RDLs), or metal bumps.

11. The device of claim 1 wherein the second conductive material(s) comprise silver-filled epoxies, interposer(s), redistribution layers (RDLs), or metal bumps.

* * * * *